United States Patent
Saia et al.

[11] Patent Number: 6,150,719
[45] Date of Patent: *Nov. 21, 2000

[54] AMORPHOUS HYDROGENATED CARBON HERMETIC STRUCTURE AND FABRICATION METHOD

[75] Inventors: Richard Joseph Saia, Niskayuna; Kevin Matthew Durocher, Waterford; James Wilson Rose, Guilderland, all of N.Y.

[73] Assignee: General Electric Company, Schenectady, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/900,141

[22] Filed: Jul. 28, 1997

[51] Int. Cl.[7] .......................... H01L 23/48; H01L 23/52; H01L 29/40
[52] U.S. Cl. .......................... 257/751; 257/751; 257/790; 257/687; 257/701; 257/702; 257/632; 257/636
[58] Field of Search ..................... 257/751, 790, 257/687, 701, 702, 632, 636

[56] References Cited

U.S. PATENT DOCUMENTS

| | | |
|---|---|---|
| 4,568,738 | 2/1986 | Keiser et al. . |
| 4,783,695 | 11/1988 | Eichelberger et al. . |
| 4,869,755 | 9/1989 | Huschka et al. . |
| 4,933,042 | 6/1990 | Eichelberger et al. . |
| 5,147,822 | 9/1992 | Yamazaki et al. . |
| 5,162,875 | 11/1992 | Birkle et al. .............. 257/636 |
| 5,336,928 | 8/1994 | Neugebauer et al. . |
| 5,524,339 | 6/1996 | Gorowitz et al. . |
| 5,527,741 | 6/1996 | Cole et al. .............. 437/209 |
| 5,601,902 | 2/1997 | Hammerschmidt et al. . |
| 5,736,448 | 4/1998 | Saia et al. .............. 438/393 |

FOREIGN PATENT DOCUMENTS

0381109 A2  1/1990  European Pat. Off. .

OTHER PUBLICATIONS

U.S. Patent Application, "Structure And Fabri Cation Method For Thin Film Capacitors" By R.J. Saia, Et Al No. 08/566,616 filed Dec. 4, 1995. Now U.S. Ser. No. 5736448 Apr. 7, 1998.

*Primary Examiner*—Mahshid Saadat
*Assistant Examiner*—Matthew E. Warren
*Attorney, Agent, or Firm*—Ann M. Agosti; Jill M. Breedlove

[57] ABSTRACT

A hard layer of amorphous hydrogenated carbon (DLC) overlies a polymer film structure and a plurality of soft layers of DLC alternate with a plurality of hard layers of DLC over the barrier base to form a corrosion resistant structure. The polymer film structure and a circuit chip can be elements of a circuit module. The DLC and the polymer film structure can have vias extending to contact pads, and a pattern of electrical conductors can extend through the vias to the contact pads. In one embodiment the DLC forms a hermetic (and therefore corrosion resistant) seal over the polymer film structure.

12 Claims, 3 Drawing Sheets

AMORPHOUS HYDROGENATED CARBON HERMETIC STRUCTURE AND FABRICATION METHOD

The invention was made with Government support under contract number F29601-92-C-0137 awarded by the Air Force. The Government has certain rights in the invention.

BACKGROUND OF THE INVENTION

The present invention relates to hermetic coatings for multichip modules and polymer film structures.

In one form of high density interconnect (HDI) circuit module, an adhesive-coated polymer film overlay having via openings covers a substrate which can support integrated circuit chips in chip wells. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Generally a plurality of polymer film overlays and metallization patterns are used.

In another form of circuit module fabrication, as described by Cole et al., U.S. Pat. No. 5,527,741, issued Jun. 18, 1996, a method for fabricating a circuit module includes using a flexible interconnect layer having patterned metallization on a base insulative layer and an outer insulative layer. At least one circuit chip having chip pads is attached to the base insulative layer and vias are formed in the outer and base insulative layers to expose selected portions of the base insulative layer metallization and the chip pads. A patterned outer metallization layer is applied over the outer insulative layer extending through selected ones of the vias to interconnect selected ones of the chip pads and selected portions of the base insulative layer metallization.

Modules fabricated using the above processes have improved reliability when effectively sealed. Conventional hermetic sealing teachings include welding, soldering, or glass-sealing a prefabricated hermetic lid to a package including the module. These processes are not conformal to the module and typically result in significant increases in packaging volume. Furthermore, when dielectric materials such as glass or ceramic are used as sealing materials, electrical input/output connections must be formed prior to sealing.

Neugebauer et al., U.S. Pat. No. 5,336,928, issued Aug. 9, 1994, describes a conformal hermetic barrier fabricated by depositing a continuous copper film and subsequently electroplating lead over the copper. The resulting conformal barrier requires a continuous metal layer and a plurality of electrical connections cannot easily be made though the hermetic layer.

SUMMARY OF THE INVENTION

Thus there is a particular need for an inexpensive conformal hermetic coating fabrication process having (a) deposition conditions compatible with module materials (preferably at temperatures below 200° C.), (b) conformal deposition over non-planar topography; (c) depositions free of pin holes; (d) appropriate dielectric properties; (e) patterning processes and materials compatible with module materials; (f) good adhesion to underlying materials and any subsequently deposited materials; (g) resistance to damage from chemical attack or mechanical abrasion; and (h) robustness in the presence of temperature fluctuations. It would further be desirable to form a plurality of electrical connections through the hermetic seal without the loss of hermeticity.

Amorphous hydrogenated carbon films, commonly referred to as diamond like carbon (DLC) films, are used as dielectric materials and as scratch protection coatings for various applications but have not been used to provide hermetic barriers.

In the present invention, DLC is deposited in multiple hard and soft layers to form a composite DLC film possessing hermetic properties.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
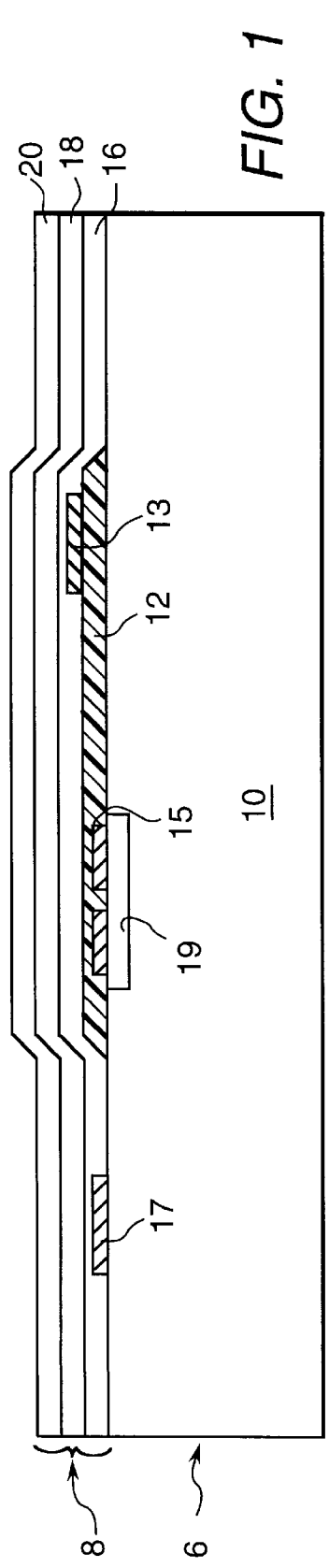
FIG. 1 is a sectional side view of a module coated with a diamond like carbon (DLC) composite film in accordance with the present invention.
Figure 2:
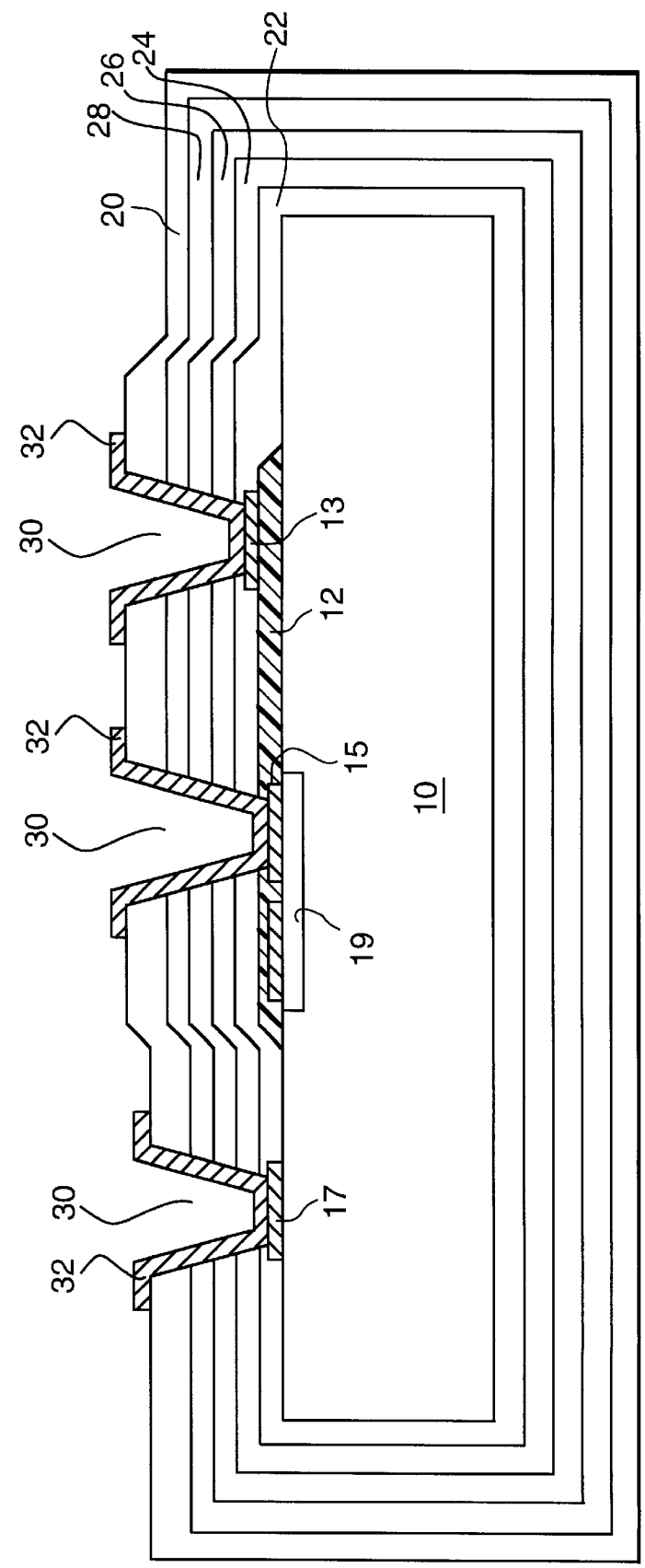
FIG. 2 is a sectional side view wherein the DLC composite film surrounds the module and further including a pattern of electrical conductors extending through vias in the DLC composite film to contact pads of the module.

FIG. 1 is a sectional side view of a module 6 having contact pads 13, 15, and 17 and coated with a DLC composite film 8, and FIG. 2 is a sectional side view wherein the DLC composite film surrounds the module and further including a pattern of electrical conductors 32 extending through vias in the DLC composite film to contact pads 13, 15, and 17 of the module.

In one embodiment, the module 6 includes a substrate 10 and a polymer film structure 12, and the contact pads 13 include a metallization layer extending over and through (not shown) the polymer film structure to interconnect chip pads 15 of circuit chips 19. Substrate 10 may comprise any suitable structural material such as a ceramic or a plastic, for example. If a plastic is used and the DLC composite film is desired for forming a hermitic seal, then the DLC composite film preferably surrounds the module, as shown in FIG. 2.

DLC composite film 8 provides a hermetic barrier, and therefore a corrosion resistant barrier. A "corrosion resistant barrier" as used in the present invention refers to a barrier which is substantially resistant to corrosion in the environment for which its use is intended. For example, military applications use the standard JESD22-A110, HAST (highly accelerated stress test) 500 hours, 130° C., 85% RH (relative humidity), and automotive applications use the standard JEDEC-STD22-A101 at 1000 hours, 85° C., 85% RH.

DLC is deposited in multiple hard and soft layers by cycling the process pressure during deposition. Chemical vapor deposition can occur in a standard parallel plate plasma reactor at temperatures below 150° C. In one embodiment, the DLC is deposited using an organic precursor which includes oxygen such as a methylethylketone (MEK) organic precursor.

Hard layers of DLC have better hermetic properties than soft layers of DLC. DLC films, however, are deposited under high stresses, and hard films, in particular, typically can not be deposited at a thickness above about 1000 Å without cracking. By alternating the hard DLC layers with lower stress, softer DLC layers, a conformal composite, pin-hole free film can be deposited to a thickness having several microns.

The hard or soft property of DLC can be obtained by controlling the DC bias voltage during film deposition. Soft DLC can be deposited in the range of about −100 volts to about −300 volts. At increasing magnitudes of bias voltage, the DLC becomes harder and more scratch resistant. In one embodiment, the magnitude of bias voltage for hard DLC deposition is greater than about −300 volts, and preferably the bias voltage magnitude is in the range of about −450 volts to about −470 volts. In the industry, the words "greater than" with respect to "bias voltage" are used to mean that the bias voltage has a higher magnitude (even though, because negative numbers are involved, a higher magnitude technically results in a lower bias voltage). The phrase "bias voltage magnitude is greater than" in the present invention description means that the bias voltage has a higher magnitude and a corresponding more negative value.

The DC self bias voltage generated at the surface of the Rf powered electrode in a plasma chemical vapor deposition (CVD) reactor is a measure of the amount of ion bombardment present. The bias voltage and the amount of ion bombardment in a plasma discharge decreases as the chamber pressure is increased. As a result, DLC deposited at low pressure is hard, and DLC deposited at high pressure is soft. The change in bias voltage can also be accomplished by changing the RF power level, but lowering the bias voltage by lowering the power results in low deposition rates.

A first layer 16 of the DLC composite film preferably comprises a hard layer of DLC because hard layers have better adhesion properties than soft layers. High pressure, soft DLC has good adhesion to the low pressure, hard DLC, very good dielectric properties and lower leakage (amps per centimeters squared) as compared with hard DLC. A cap (outer) layer 20 of the DLC composite film preferably comprises a hard layer of DLC because hard layers offer more scratch protection. Preferably, a plurality of layers of hard DLC are alternately applied with a plurality of layers of soft DLC until a desired thickness is achieved, as shown in FIG. 2 with hard DLC layers 22, 26, and 20 and soft DLC layers 24 and 28. A preferred thickness range of the DLC composite film is from about 0.5 micrometers to about 2 micrometers. In one embodiment, this thickness range is achieved with at least four layers of hard DLC and at least 4 layers of soft DLC.

DLC composite film 8 forms a seal to substrate 10 and surrounds the material to be sealed. In the embodiment of FIG. 1, this material is the polymer film structure 12. Polymer film structure 12 comprises a material on which DLC can be deposited. In one embodiment the polymer film structure comprises KAPTON™ polyimide (KAPTON is a trademark of E.I. duPont de Nemours and Company). In a preferred embodiment, the material is KAPTON E polyimide, which has a low coefficient of thermal expansion (about 17 parts per million per degree Celsius). If desired, in addition to sealing the polymer film structure, the DLC can be deposited on all sides of module 6.

In order to make an electrical contact to contact pads, the DLC composite film 8 is patterned and etched. The etching of vias 30 can be performed using an oxygen plasma mask process or an argon ion laser ablation, for example. Vias can be etched to contact pads 13 on top of overlay structure 12. If desired, vias can be etched to chip pads 15 or substrate metallization 17.

After etching, the pattern of electrical conductors 32 can be deposited on the DLC composite film, in the vias, and on the contact pads. The pattern of electrical conductors may comprise one or more layers of electrically conductive material. The layer adjacent the DLC composite film comprises a material capable of providing good adhesion to the DLC composite film such as titanium or tantalum, for example. In one embodiment, the pattern of electrical conductors comprises a layer of titanium having a thickness of 1000 Å, coated by a layer of copper having a thickness of 4 microns, coated by a layer of titanium having a thickness of 1000 Å. In another embodiment, the pattern of electrical conductors comprises a layer of titanium having a thickness of 1000 Å, coated by a layer of copper having a thickness of 4 microns, coated by a layer of nickel having a thickness of 1 micron, coated by a layer of gold having a thickness of 1500 Å. The pattern of electrical conductors provides a corrosion resistant seal to the DLC composite film and can provide a hermetic barrier. The advantageous ability to make electrical connections through a hermetic barrier of DLC is possible because the DLC is a dielectric material and not a conductive material. DLC is substantially inert to chemical attack and can be patterned by using oxygen plasma techniques or laser ablation.

Figure 3:
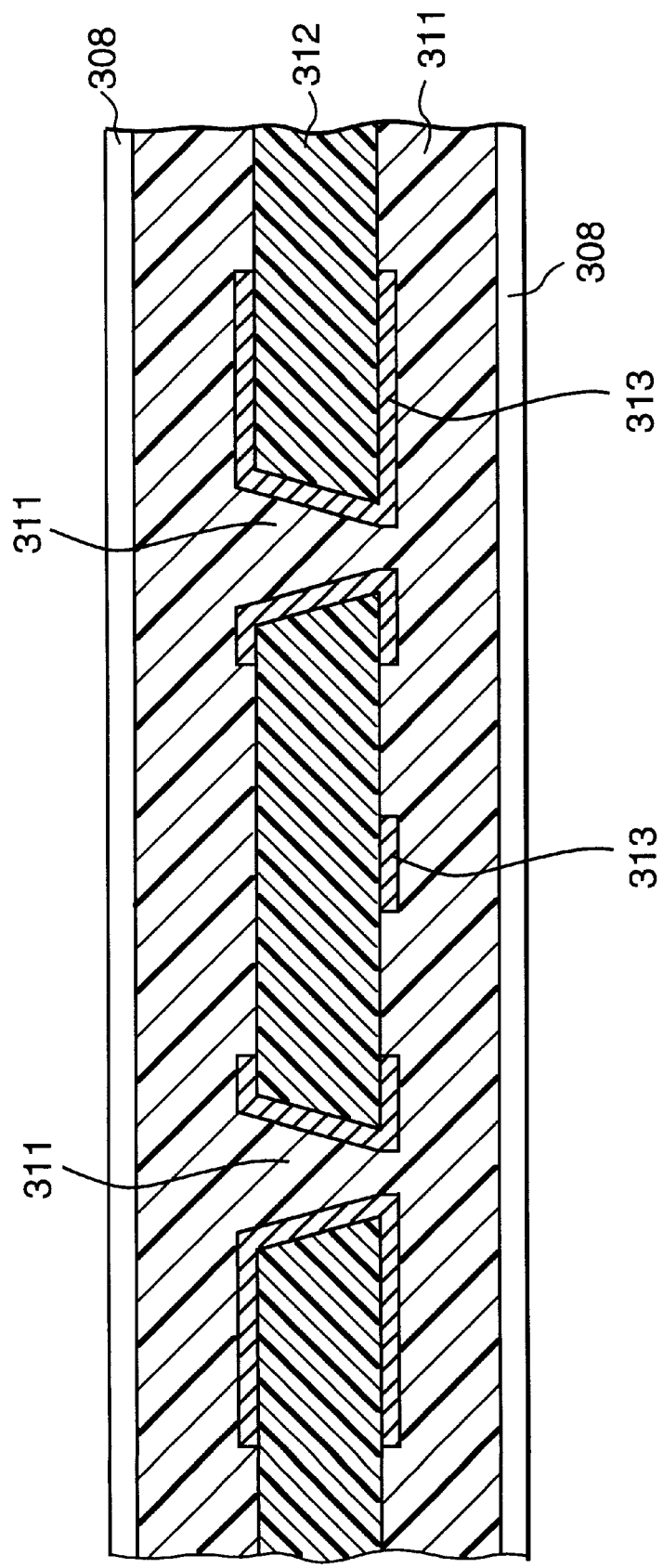
FIG. 3 is a sectional side view showing a polymer film structure coated with a DLC composite film.

In another embodiment, the DLC composite film can be used to prevent the corrosion of flexible metal interconnections on polymer film structures. FIG. 3 is a sectional side view illustrating a free standing polymer film structure 312 coated on both sides with a polymer passivation layer 311. The polymer film structure 312 can include metallization 313 on one or both sides. DLC composite film 308 can be applied over the polymer passivation layer 311 in a similar manner as discussed above with respect to FIGS. 1 and 2.

EXAMPLE

DLC composite film was deposited on a 0.025 mm thick KAPTON E polyimide film using a methylethylketone (MEK) precursor for evaluation purposes. Four layers of hard DLC, each having a thickness of 450 Å, were alternated with four layers of soft DLC, each having a thickness of 3000 Å. A cap layer of hard DLC was deposited to a thickness of 1000 Å. with the total thickness of all the layers being 1.45 $\mu$m. During deposition, the pressure was automatically cycled using a microprocessor, and the electrode temperature was maintained at 50° C. to reduce the redeposition of volatile organic species in the plasma.

Each of the four layers of hard DLC was deposited at a rate of 230 Å/min with a flow of 15 sccm (standard cubic centimeters per minute), a power of 50 W (watts) (DC bias −470 volts), and a pressure of 30 mtorr. Each of the four layers of soft DLC was deposited at a rate of 300 Å/min with a flow of 15 sccm, a power of 50 W (DC bias −110 volts), and a pressure of 500 mtorr. The cap layer of hard DLC was deposited at a rate of 230 Å/min with a flow of 15 sccm, a power of 50 W (DC bias −470 volts), and a pressure of 30 mtorr.

Hermeticity was tested by measuring helium penetration through the test films using a quadrapole mass spectrometer. The film was mounted in a two cell vacuum vessel with the sample film separating upper and lower cells. After loading, both cells were evacuated and out-gassing was monitored in the lower cell until the sample stabilized at a pressure less than or equal to 1 millitorr. The baseline pressure was recorded using a Baratron gauge, and the mass peak at 4 amu (atomic mass unit-helium) was recorded using the mass spectrometer. Helium was then introduced to the upper cell, and the pressure was brought up to 7.3 grams per square centimeter(g/cm$^2$). The pressure differential across the sample membrane was approximately 14.7 g/cm$^2$.

Then the valve to the turbomolecular pump/mass spectrometer was closed, and the pressure change in the lower cell was monitored. Measurements were taken every 60 seconds for 30 minutes. The valve to the mass spectrometer was next briefly opened so that it could be verified that the primary species that penetrated the sample membrane was helium. The rate of the pressure rise in the test was assumed to be a measure of helium penetration.

Figure 4:
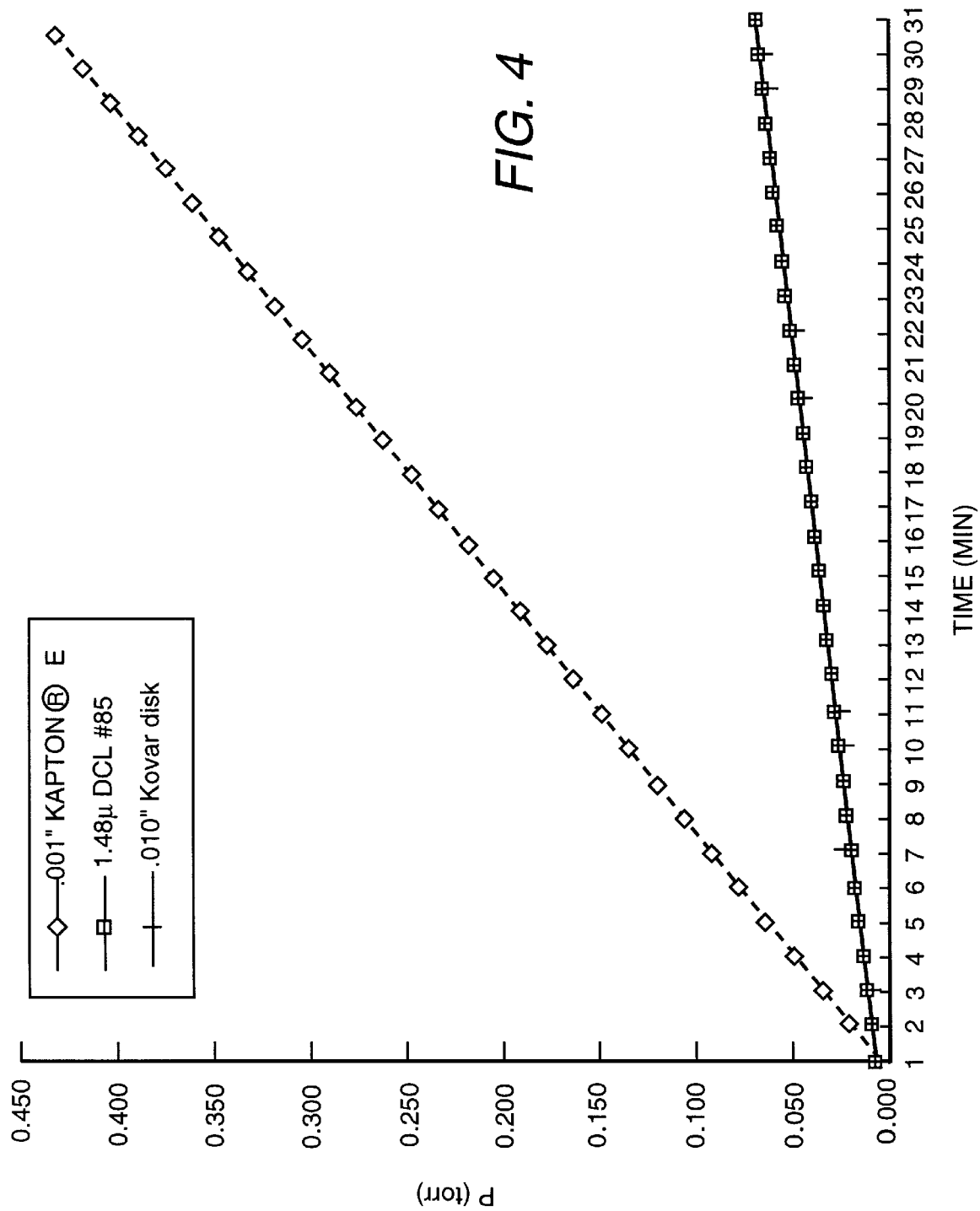
FIG. 4 is a graph illustrating the hermetic properties obtained with samples of the present invention.

FIG. 4 is a graph illustrating the pressure rise obtained with samples described above, a 0.025 mm thick sample of KAPTON E polyimide without any DLC composite film, and a 0.25 mm sample of a Kovar metal disk. The pressure rise associated with the Kovar disk represents background noise. There is a substantial pressure rise from helium penetration through the uncoated KAPTON E polyimide. The DLC coated polyimide, however, had a pressure rise substantially the same as that of the Kovar disk. Furthermore, no helium penetration was observed with the mass spectrometer.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A hermetic structure comprising:
   a circuit module including a circuit chip and contact pads;
   a diamond like carbon (DLC) composite film including a barrier base comprising a hard layer of DLC over the circuit module and a plurality of soft layers of DLC alternating with a plurality of hard layers of DLC over the barrier base, the DLC composite film having vias therein extending to the contact pads; and
   a pattern of electrical conductors extending through the vias to the contact pads and providing a corrosion resistant seal to the DLC composite film, the DLC composite film and the pattern of electrical conductors providing a hermetic barrier for the circuit chin and contact pads.

2. The structure of claim 1 wherein the pattern of electrical conductors comprises a multilayer pattern of electrical conductors with a first conductive layer in contact with the DLC composite film and the contact pads and comprising an adhesion promoting conductive material.

3. The structure of claim 2 wherein the first conductive layer is titanium or tantalum.

4. The structure of claim 2 wherein the first conductive layer comprises titanium and the pattern of electrical conductors includes a second conductive layer overlying the first conductive layer and comprising copper.

5. The structure of claim 4 wherein the pattern of electrical conductors includes a third conductive layer overlying the second conductive layer and comprising titanium or gold.

6. The structure of claim 1 wherein the circuit module includes a polymer film structure over the circuit chip and wherein the DLC composite film forms a hermetic seal over the polymer film structure of the circuit module.

7. The structure of claim 6 wherein the polymer film structure includes metallization thereon and the contact pads comprise portions of the metallization.

8. The structure of claim 1, wherein the circuit module includes a substrate supporting the circuit chip.

9. The structure of claim 8, wherein the substrate comprises plastic and wherein the DLC composite film surrounds the circuit module.

10. The structure of claim 8, wherein the substrate includes metallization thereon and the contact pads comprise portions of the metallization.

11. The structure of claim 1, wherein the circuit chip includes chip pads and the contact pads comprise the chip pads.

12. A hermetic structure comprising:
    a circuit module including a circuit chip and contact pads;
    a diamond like carbon (DLC) composite film including a barrier base comprising a hard layer of DLC over the circuit module and a plurality of soft layers of DLC alternating with a plurality of hard layers of DLC over the barrier base, the DLC composite film having vias therein extending to the contact pads; and
    a pattern of electrical conductors extending through the vias to the contact pads and providing a corrosion resistant seal to the DLC composite film, the pattern of electrical conductors comprising a multilayer pattern of electrical conductors with a first conductive layer in contact with the DLC composite film and the contact pads and comprising an adhesion promoting conductive material, the DLC composite film and the pattern of electrical conductors providing a hermetic barrier for the circuit chip and contact pads.

* * * * *

UNITED STATES PATENT AND TRADEMARK OFFICE
CERTIFICATE OF CORRECTION

PATENT NO. : 6,150,719

DATED : November 21, 2000

INVENTOR(S) : Richard James Saia, Kevin Matthew

It is certified that error appears in the above-identified patent and that said Letters Patent is hereby corrected as shown below:

Claim 1, Column 5, line 48 is printed as "circuit chin" should be printed as --circuit chip--

Signed and Sealed this

First Day of May, 2001

Attest:

NICHOLAS P. GODICI

*Attesting Officer*         *Acting Director of the United States Patent and Trademark Office*